United States Patent
Seddon

(10) Patent No.: US 8,871,613 B2
(45) Date of Patent: Oct. 28, 2014

(54) SEMICONDUCTOR DIE SINGULATION METHOD

(75) Inventor: Michael J. Seddon, Gilbert, AZ (US)

(73) Assignee: Semiconductor Components Industries, LLC, Phoenix, AZ (US)

(*) Notice: Subject to any disclaimer, the term of this patent is extended or adjusted under 35 U.S.C. 154(b) by 88 days.

(21) Appl. No.: 13/526,140

(22) Filed: Jun. 18, 2012

(65) Prior Publication Data

US 2013/0337633 A1  Dec. 19, 2013

(51) Int. Cl.
*H01L 21/78* (2006.01)
*H01L 21/822* (2006.01)

(52) U.S. Cl.
CPC .............. *H01L 21/78* (2013.01); *H01L 21/822* (2013.01)
USPC .... 438/463; 438/462; 438/464; 257/E21.599; 257/620; 257/622

(58) Field of Classification Search
CPC .............................. H01L 21/78; H01L 21/822
USPC .......... 438/462, 463, 464; 257/E21.599, 620, 257/622
See application file for complete search history.

(56) References Cited

U.S. PATENT DOCUMENTS

| 4,237,601 | A  | * | 12/1980 | Woolhouse et al. ............ 438/33 |
| 6,177,352 | B1 | * | 1/2001  | Schonfeld et al. ............ 438/701 |
| 7,781,310 | B2 |   | 8/2010  | Grivna |
| 7,906,410 | B2 |   | 3/2011  | Arita et al. |
| 7,985,661 | B2 |   | 7/2011  | Grivna |
| 7,989,319 | B2 |   | 8/2011  | Grivna et al. |
| 8,012,857 | B2 |   | 9/2011  | Grivna et al. |
| 2008/0070380 | A1 | * | 3/2008 | Kusunoki ................. 438/462 |
| 2011/0175209 | A1 |  | 7/2011 | Seddon et al. |
| 2011/0175225 | A1 |  | 7/2011 | Seddon et al. |
| 2011/0175242 | A1 |  | 7/2011 | Grivna et al. |
| 2011/0177675 | A1 |  | 7/2011 | Grivna et al. |
| 2011/0195537 | A1 | * | 8/2011 | Koyanagi et al. ............... 438/33 |
| 2011/0244657 | A1 |  | 10/2011 | Grivna et al. |

OTHER PUBLICATIONS

Hans-Ulrich Zühlke, Gabriele Eberhardt and Ronny Ullmann, "TLS-Dicing", European-Russian Semiconductor Technology Conference 2009 on Networking, Jun. 4, 2009, Moscow.

* cited by examiner

*Primary Examiner* — Kimberly Rizkallah
*Assistant Examiner* — Maria Ligai
(74) *Attorney, Agent, or Firm* — Kevin B. Jackson

(57) ABSTRACT

In one embodiment, semiconductor die are singulated from a semiconductor wafer by forming trenches along singulation lines and initiating a cracks from within the trenches, which propagate through the semiconductor wafer in a more controlled manner.

20 Claims, 4 Drawing Sheets

SEMICONDUCTOR DIE SINGULATION METHOD

BACKGROUND OF THE INVENTION

The present invention relates, in general, to electronics, and more particularly, to methods of forming semiconductors.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel along scribe grids that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe all of the scribe grids on the entire semiconductor wafer could take over one hour or more. This time reduced the throughput and manufacturing capacity of a manufacturing area.

Other methods have been explored as alternatives to scribing, which have included thermal laser separation (TLS), stealth dicing (laser dicing from the backside of the wafer), and plasma dicing. However, the other methods have had several manufacturing challenges, which have included uncontrollable crack propagation, non-compatibility with backmetal layers, added passivation layers, limitations on die size reduction, and degraded device electrical characteristics.

Accordingly, it is desirable to have a method of singulating die from a semiconductor wafer that is controllable, that is compatible with wafers having backmetal, that can be used to separate smaller semiconductor die, that provides more uniform and reliable singulation, that reduces the time to perform the singulation, and that has a narrower scribe line. Also, it would be advantageous if the method is compatible with wafers having backside coating materials (WBC).

For simplicity and clarity of the illustration, elements in the figures are not necessarily to scale, and the same reference numbers in different figures denote the same elements. Additionally, descriptions and details of well-known steps and elements are omitted for simplicity of the description. For clarity of the drawings, doped regions of device structures may be illustrated as having generally straight line edges and precise angular corners. However, those skilled in the art understand that due to the diffusion and activation of dopants the edges of doped regions generally may not be straight lines and the corners may not be precise angles. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

Figure 1:
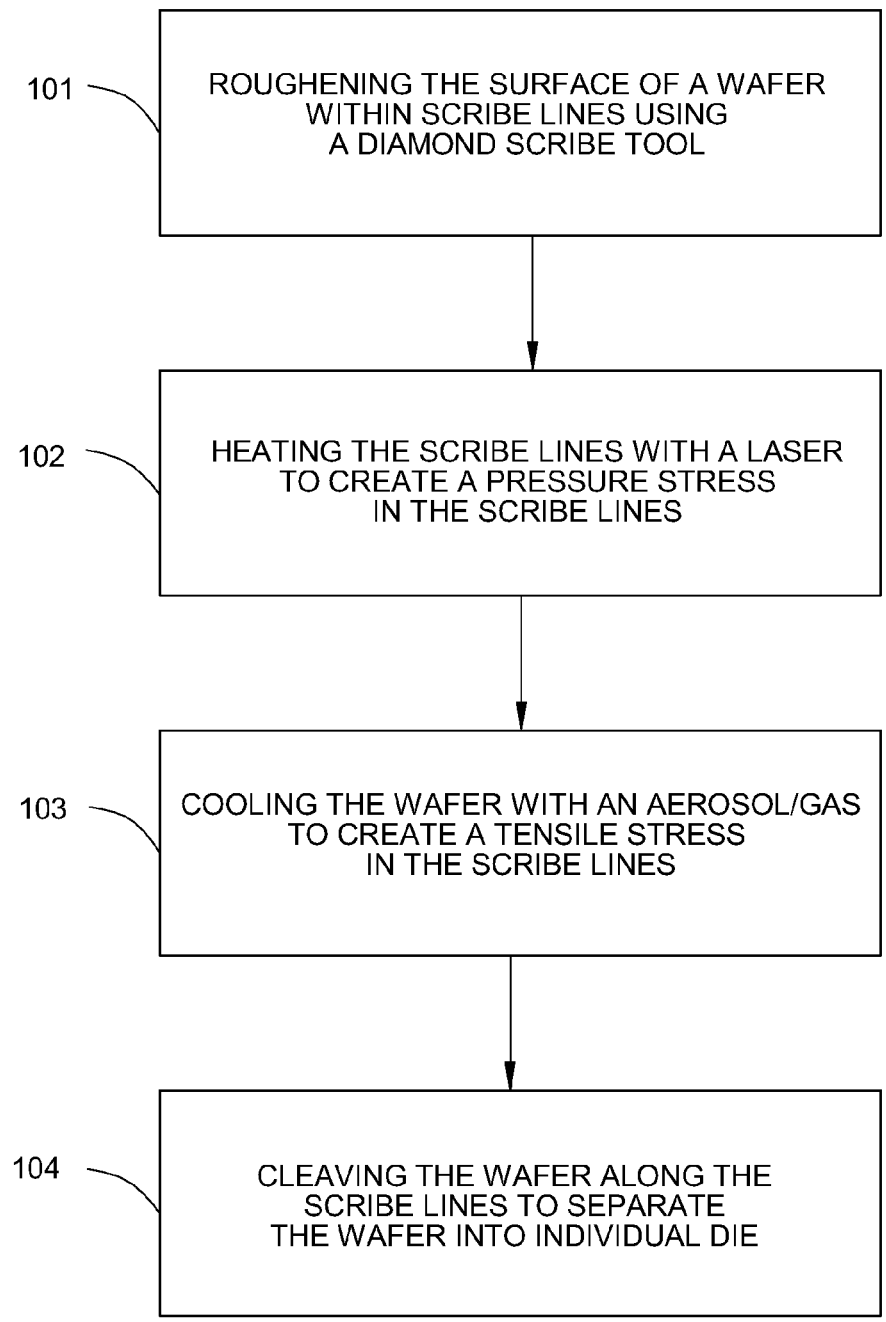
FIG. 1 illustrates a related process flow for singulating a semiconductor wafer.

FIG. 1 is a process flow diagram showing a related process for die singulation that has been proposed using thermal laser singulation (TLS). In step 101, a diamond scribe tool is used to roughen the surface within the scribe lines of a wafer. In view of the crystal orientation of the wafer, the diamond scribe surface roughening process is faster in one direction (for example, scribe lines perpendicular to the wafer notch (or flat)), but much slower in the other direction (for example, scribe lines parallel to the wafer notch (or flat)) to avoid excessive chipping and other damage to the wafer. Thus, the diamond scribe roughening process is very slow, which impacts manufacturing cycle time. Also, the diamond scribe roughening process can damage die if the scribe device is not aligned properly at the start of the process, or becomes misaligned during the process.

In step 102, the scribe lines are locally heated using a laser, which heats the scribe lines at a temperature of about 400 degrees Celsius for about one millisecond. The heat affected zone is about 30 microns. In step 103, an aerosol/gas, such as a water or air jet, is used to cool the wafer, which creates a tensile stress in the scribe lines. In step 104, the tensile stress formed by the cooling effect of step 103 creates cracks that propagate downward through the wafer, which cleaves the wafer along the scribe lines thereby separating die on the wafer into individual units.

In addition to the slow cycle time associated with the diamond scribe roughening process described in step 101, the proposed TLS process has other limitations. For example, it is difficult to actually control the direction that the crack propagates to separate the wafer into individual die. In particular, the cracks have been found to not only propagate within the scribe lines, but the cracks have been found to further propagate into the active area of the die, which destroys the die. In addition, the process described in FIG. 1 cannot be used to process die that are smaller than 2 millimeters by 2 millimeters square because of, among other things, the inability to control how the cracks propagate.

Figure 2:
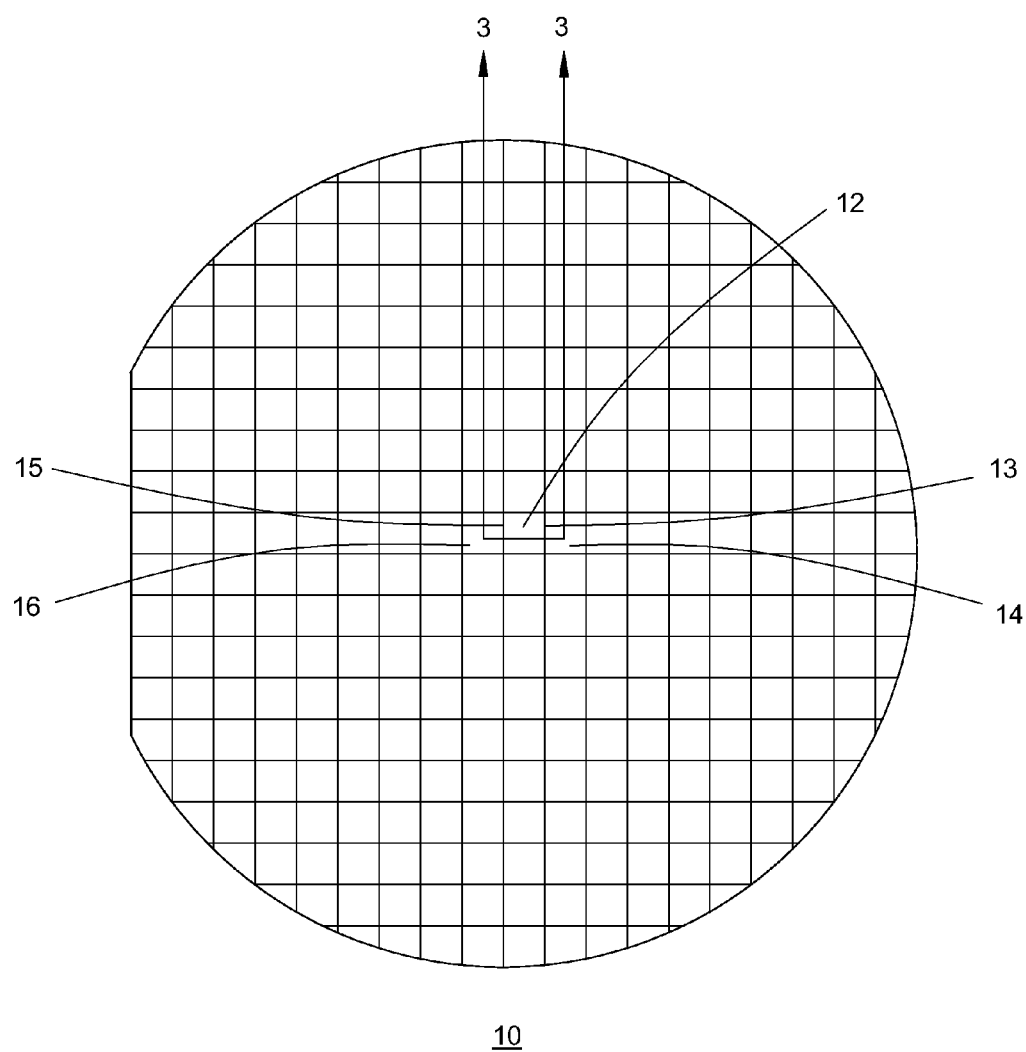
FIG. 2 illustrates a reduced plan view of an embodiment of a semiconductor wafer in accordance with the present invention.

Turning now to FIGS. 2-5, a method is described in accordance with one embodiment for wafer singulation, which addresses, at least in part, some of the issues described above in conjunction with FIG. 1. In general, the method is useful for die singulation techniques that use localized heating techniques to initiate crack propagation in a more controlled manner. FIG. 2 is a reduced plan view graphically illustrating a semiconductor wafer 10 that has a plurality of semiconductor die, such as die 12, 14, and 16, formed on semiconductor wafer 10. Die 12, 14, and 16 are spaced apart from each other on wafer 10 by spaces in which singulation lines are to be formed, such as scribe lines or singulation lines 13 and 15. As is well known in the art, all of the semiconductor die on wafer 10 generally are separated from each other on all sides by areas where scribe lines, such as scribe lines 13 and 15 are to be formed.

Figure 3:
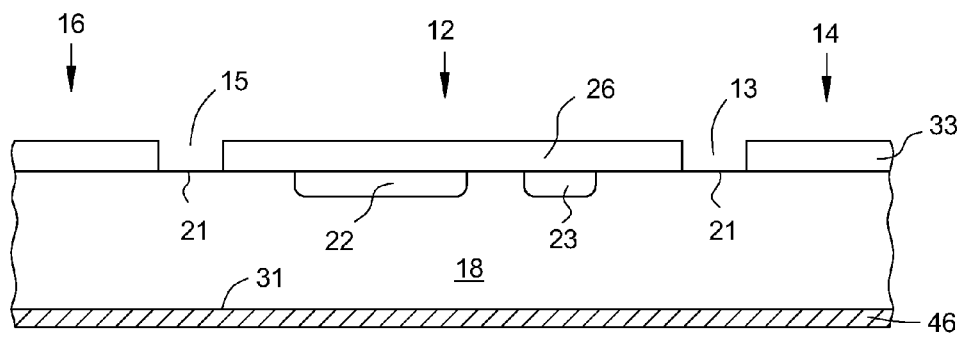
FIGS. 3-5 illustrate partial cross-sectional views of an embodiment of a portion of the semiconductor wafer of FIG. 2 at various stages in a process of singulating die from the wafer in accordance with an embodiment of the present invention.

FIG. 3 illustrates an enlarged cross-sectional portion of wafer 10 of FIG. 2 taken along section line 3-3. For clarity of the drawings and of the description, this section line 3-3 is illustrated to cross-section only die 12 and portions of dice 14 and 16. Die 12, 14, and 16 may be any type of semiconductor die including a vertical transistor, a lateral transistor, or an integrated circuit that includes various types of semiconductor devices. Semiconductor dice 12, 14, and 16 generally include a semiconductor substrate 18 that may have doped regions formed within substrate 18 in order to form active and passive portions of the semiconductor die. This is generally illustrated in a non-limiting way with regions 22 and 23. Layer or layers of material 33 are formed overlying substrate 18, and can be dielectric materials, conductive materials, doped and/or undoped semiconductor materials, or combinations thereof. For ease of understanding, layer of material 33 is illustrated as a single layer in FIGS. 3-9. In one embodiment, layer of material 33 can be a dielectric material, such as an oxide, a nitride, polyimide, combinations thereof, or other related or equivalent materials as known by one of ordinary skill in the art.

In one embodiment, at least a portion of layer of material 33 can be removed in scribe lines 13 and 15 to reduce the thickness of layer of material 33 proximate to scribe lines 13 and 15. In one embodiment, all of layer of material 33 adjacent scribe lines 13 and 15 can be removed to expose major surface 21 of wafer 10 in scribe lines 13 and 15. Wafer 10 is further illustrated including an optional layer 46 formed adjacent major surface 31. In one embodiment, layer 46 can be configured as a conductive layer, such as a backmetal layer, and can be a metal structure including a solderable metal structure, such as titanium-nickel-silver, chromium-nickel-gold, or other related or equivalent materials as known by one of ordinary skill in the art. In one embodiment, layer 46 can be a die attach film or a wafer backside coating (WBC). In one embodiment, layer 46 can be a die attach epoxy film applied, for example, in wafer form.

Figure 4:
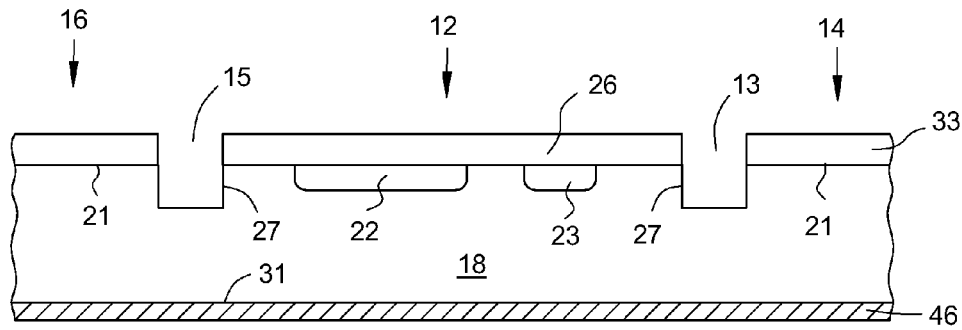

FIG. 4 illustrates an enlarged cross-sectional portion of wafer 10 after further processing. In one embodiment, portions of major surface 21 are removed within scribe lines 13 and 15 to form trenches 27. In one embodiment, a masking layer (not shown) can be formed overlying layers of material 33 and openings formed in layer of material 33 corresponding to scribe lines 13 and 15. Portions of layer of material 33 can be removed, and then portions of wafer 10 can be removed to form trenches 27.

In one embodiment, trenches 27 can have a depth 51 of greater than five microns. In one embodiment, depth 51 can be greater than or equal to ten microns. In one embodiment, depth 51 can be in a range from (and including) ten microns to 30 microns. In accordance with the present embodiment, trenches 27 are configured to help create a stress concentration area within scribe lines 13 and 15, and to improve control of crack propagation during subsequent processing, such as localized heating techniques, including thermal laser singulation. In one embodiment, trenches 27 can have square or rectangular shapes as generally illustrated in FIG. 4. In one embodiment, trenches 27 can have a triangular or sloped-sidewall shape as generally illustrated as trench 271 in FIG. 6. In one embodiment, trenches 27 can have a generally rounded or elliptical shape as illustrated as trench 272 in FIG. 7.

In one embodiment, anisotropic etching can be used to form trenches 27. In one embodiment, trenches 27 can be formed using plasma etching techniques with a fluorocarbon or fluorine-based chemistry (for example, $SF_6/O_2$). In one embodiment, isotropic etching can be used to form trenches 27. In one embodiment, trenches 27 can be formed using wet chemical etching, such as nitric acid and hydrofluoric acid ($HNO_3$/HF) etchants. In one embodiment, a combination of anisotropic and isotropic etching can be used to form trenches 27. In one embodiment, trenches 27 can be formed using a caustic etchant, such as potassium hydroxide (KOH).

In one embodiment, trenches 27 can be formed using a partial sawing process with an ultra-narrow saw blade (about 5 to 10 microns in thickness). In one embodiment, bottom surfaces 270 of trenches 27 can be formed to have a rough versus smooth texture to help increase stress concentration areas during subsequent processing, which can help guide crack propagation. In one embodiment, bottom surfaces 270 can be treated with a diamond scribe to roughen them. In one embodiment, bottom surfaces 270 can be treated with a laser to roughen them. In one embodiment, bottom surfaces 270 can be treated with dry plasma etch roughening techniques.

Figure 5:
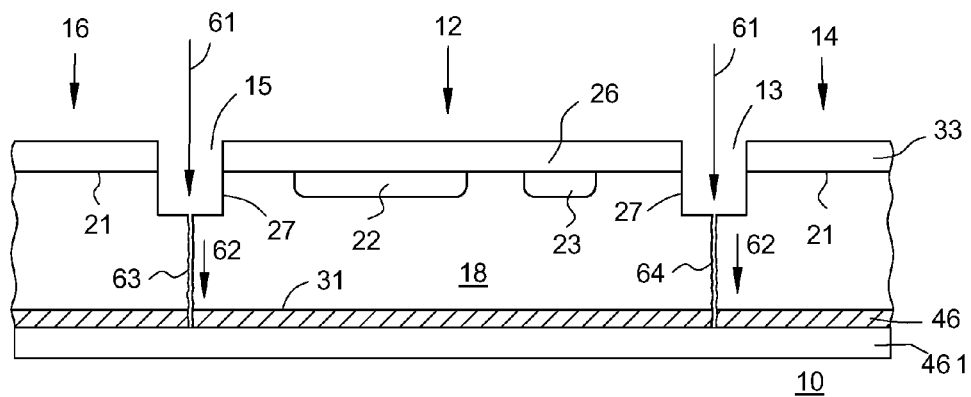
Figure 6:
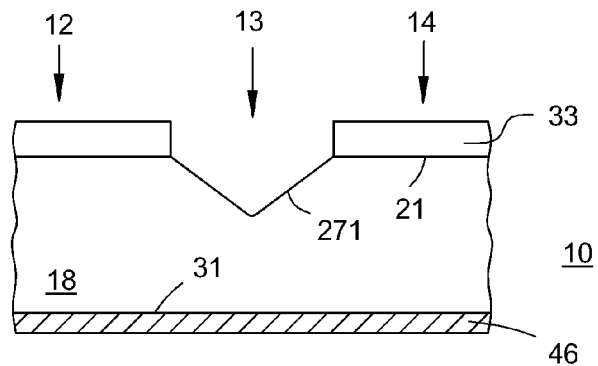
FIG. 6 illustrates a partial cross-sectional view of an embodiment of a semiconductor wafer in accordance with an additional embodiment of the present invention.
Figure 7:
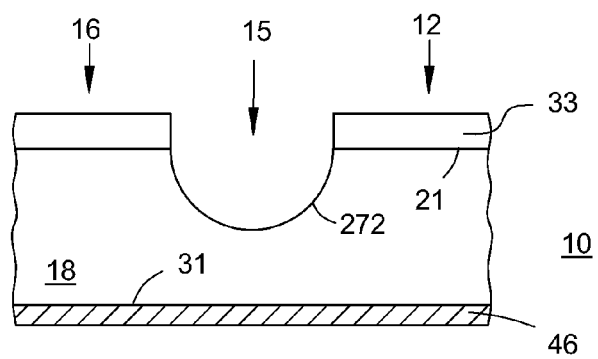
FIG. 7 illustrates a partial cross-sectional view of an embodiment of a semiconductor wafer in accordance with another embodiment of the present invention.

FIG. 5 illustrates an enlarged cross-sectional portion of wafer 10 after additional processing. In one embodiment, wafer 10 can be mounted to a common carrier substrate or material 461, such as an expandable carrier tape. In one embodiment, wafer 10 can be subjected to a localized heating process that locally heats scribe lines 13 and 15 within trenches 27 as generally represented by arrows 61. In one embodiment, scribe lines 13 and 15 within trenches 27 can be locally heated using a thermal laser, which creates a localized stress within trenches 27. By way of example, thermal laser processing equipment is available from companies, such as Jenoptik AG of Jena, Germany. In one embodiment, wafer 10 is heated to a temperature of about 400 degrees Celsius for about one millisecond. The heat affected zone is about 30 microns. In one embodiment, wafer 10 can be locally heated without significant melting of the semiconductor material.

Wafer 10 can then be subjected to a process that causes cracks to propagate through scribe lines 13 and 15. In one embodiment, a cooling process can be used, which can form tensile stresses within trenches 27 that results in cracks 63 and 64 propagating generally downward (as represented by arrows 62) towards major surface 31 to singulate wafer 10 into individual die 12, 14, and 16 as generally illustrated in FIG. 5. Cracks 63 and 64 can also propagate through conductive layer 46 to obtain singulation without having to use additional processing steps. In one embodiment, a water jet can be used to cool wafer 10 to initiate the crack propagation. In one embodiment, an air jet can be used to cool wafer 10 to initiate the crack propagation.

The method and structure described in FIGS. 2-5 was found to have improved results compared to related processes. For example, trenches 27 were found to improve the control of the crack propagation process to reduce encroachment of the cracks into device active areas compared to related thermal laser singulation processes. Also, the minimum die size was reduced from about 2 millimeters by 2 millimeters to about 0.5 millimeters by 0.5 millimeters and smaller. In addition, the method and structure support using backmetal layers, such as conductive layer 46, which is an improvement over related processes, such as stealth dicing. Specifically it was found that the cracks also propagate through the backmetal without having to use additional processing steps. Additionally, the method and structure support reducing the width of scribe lines 13 and 15 to about 15 microns to about 30 microns compared to related processes that require scribe lines 150 microns wide. Further, the method and structure improve the ability to produce more accurate die sizes and consistent shapes with cleaner and sharper singulation lines, which is helpful for applications that require close placement of die, such as multi-chip packages or modules for medical applications. The method and structure can also be used with UV sensitive devices and devices having tunable structures, which are sensitive to related processes, such as plasma dicing. The method and structure can further be used for singulating thicker wafers (for example, wafers thicker than 200 microns) without impacting process throughput, which is an improvement over related processes, such as plasma dicing.

Figure 8:
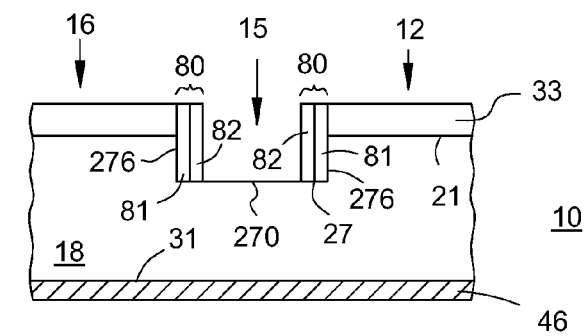
FIG. 8 illustrates a partial cross-sectional view of an embodiment of a semiconductor wafer in accordance with further embodiment of the present invention.

FIG. 8 illustrates an enlarged cross-section view of a portion of wafer 10 in accordance with another embodiment. In one embodiment, a layer 80 of material can formed along sidewall surfaces 276 of trench 27. In one embodiment, layer 80 can be a reflective or mirror-like material. In one embodiment, layer 80 can be a material configured for at least partial specular reflection of laser light. In one embodiment, layer 80 can be a generally smooth metal material, such as chrome, silver, or gold, or other related or equivalent materials as known by one of ordinary skill in the art. In one embodiment, layer 80 can include more than one layer, such as layers 81 and 82. In one embodiment, layer 81 can be a dielectric material, and layer 82 can be a reflective material. In one embodiment, layer 81 can be an oxide material. In one embodiment, layer 82 can be a generally smooth metal material, such as chrome, silver, or gold, or other related or equivalent materials as known by one of ordinary skill in the art. In one embodiment, layer 80 can be formed using one or more spacer formation techniques, which remove portions of layer 80 along lower surface 270 of trench 27 while leaving other portions of layer 80 along sidewall portions 276.

Figure 9:
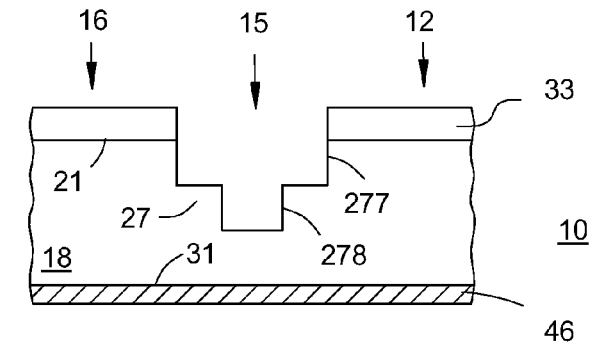
FIG. 9 illustrates a partial cross-sectional view of an embodiment of a semiconductor wafer in accordance with a still further embodiment of the present invention.

FIG. 9 illustrates an enlarged cross-section view of a portion of wafer 10 in accordance with a further embodiment. In one embodiment, trench 27 can include a trench-within-trench configuration. In one embodiment, a trench portion 277 can be formed in scribe line 15, and a trench portion 278 can be formed within trench portion 277. In one embodiment, trench portion 278 can have a narrower width compared to trench portion 277. In one embodiment, trench portion 278 can be formed using spacers (not shown) within trench portion 277 leaving a portion of the bottom surface of trench portion 277 exposed. Trench portion 278 can then be formed self aligned to the spacers. The spacers can be removed or left in place after trench portion 278 is formed.

From all of the foregoing, one skilled in the art can determine that according to one embodiment, a method of singulating semiconductor die from a semiconductor wafer comprises providing a semiconductor wafer (for example, element 10) having a plurality of semiconductor die (for example, elements 12, 14, 16) formed on the semiconductor wafer and separated from each other by portions of the semiconductor wafer by singulation lines (for example, elements 13, 15). The method includes forming trenches (for example, element 27) within the singulation lines. The method includes forming localized stresses within the trenches to form cracks (for example, elements 63, 64) within trenches. The method includes propagating (for example, element 62) the cracks through the semiconductor wafer using the trenches to control crack propagation.

From all of the foregoing, one skilled in the art can determine that according to another embodiment, in the method described in paragraph [0022], the step of forming the trenches can include forming trenches having a depth (for example, element 51) greater than or equal to ten microns.

From all of the foregoing, one skilled in the art can determine that according to further embodiment, in the method described in paragraph [0022], the step of providing the semiconductor wafer can include providing a semiconductor wafer having a backmetal layer (for example, element 46), and wherein propagating the cracks comprises propagating the cracks through the backmetal layer.

From all of the foregoing, one skilled in the art can determine that according to a another embodiment, a method of singulating semiconductor die from a semiconductor wafer comprises providing a semiconductor wafer (for example, element 10) having a plurality of semiconductor die (for example, elements 12, 14, 16) formed on the semiconductor wafer and separated from each other by portions of the semiconductor wafer by singulation lines (for example, elements 13, 15) having trenches (for example, element 27) formed therein. The method includes heating (for example, element 61) the trenches to form a localized stress in the trenches. The method includes cooling the trenches thereby propagating (for example, element 62) cracks (for example, elements 63, 64) within the trenches and into the semiconductor wafer to singulate the semiconductor die from the semiconductor wafer.

From all of the foregoing, one skilled in the art can determine that according to further embodiment, in the method described in paragraph [0025], the step of heating the trenches can include heating the trenches with a laser From all of the foregoing, one skilled in the art can determine that according to another embodiment, a method of singulating semiconductor die from a semiconductor wafer comprises providing a semiconductor wafer (for example, element 10) having a plurality of semiconductor die (for example, elements 12, 14, 16) formed on the semiconductor wafer and separated from each other by portions of the semiconductor wafer by singulation lines (for example, elements 13, 15 having trenches (for example, element 27) formed therein. The method includes heating (for example, element 61) the trenches with a thermal laser to form a localized stress in the trenches. The method includes cooling the trenches to form cracks (for example, elements 63, 64) within the trenches. The method includes propagating (for example, element 62) the cracks into the semiconductor wafer to singulate the semiconductor die from the semiconductor wafer, wherein the trenches are configured to control crack propagation.

From all of the foregoing, one skilled in the art can determine that according to further embodiment, in the method described in paragraph [0027], the step of providing the semiconductor wafer can include providing the semiconductor wafer, wherein the trenches comprise one of a rounded shape (for example, element 272), a square shape (for example, element 27), or a triangular shape (for example, element 271).

From all of the foregoing, one skilled in the art can determine that according to a still further embodiments, in the methods described herein, the step of providing the semiconductor wafer can include providing the semiconductor wafer further including a wafer backside material (for example, element 46) on a major surface (for example, element 31).

In view of all of the above, it is evident that a novel method is disclosed. Included, among other features, is forming trenches within scribe lines on a substrate, locally heating surfaces of the trenches, and cooling the substrate to initiate cracks, which can propagate from the trenches downward through the substrate to singulate the substrate into multiple die. The method provides, among other things, improved control of singulation processes, which improves yields and device reliability. The method also supports smaller scribe line widths, which provides more die per wafer thereby reducing die manufacturing costs. Additionally, the method can be implemented using existing process equipment, which saves on implementation costs.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, trenches 27 can have other shapes, such as polygonal shapes. Also, termination features can be added adjoining or in proximity to the scribe lines, such as insulated trenches, doped regions, or other isolation structures.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of singulating semiconductor die from a semiconductor wafer comprising:
providing a semiconductor wafer having a plurality of semiconductor die formed on the semiconductor wafer and separated by singulation lines, wherein the singulation lines are portions of the semiconductor wafer;
forming trenches within the singulation lines;
locally heating lower surfaces of the trenches to form localized stresses within the trenches without forming molten matter; and
cooling the semiconductor wafer to propagate cracks generally downward and completely through the semiconductor wafer using the trenches to control crack propagation.

2. The method of claim 1, wherein locally heating the lower surfaces comprises a temperature of approximately 400 degrees Celsius.

3. The method of claim 1, wherein heating the trenches comprises heating with a thermal laser process.

4. The method of claim 1, wherein forming the trenches comprises etching the semiconductor wafer.

5. The method of claim 4, wherein etching the semiconductor wafer comprises etching with an anisotropic etchant.

6. The method of claim 4, wherein etching the semiconductor wafer comprises etching with an isotropic etchant.

7. The method of claim 1, wherein forming the trenches comprises forming trenches having a depth greater than or equal to ten microns.

8. The method of claim 7, wherein forming the trenches comprises forming the trenches having a depth from about ten microns to about thirty microns.

9. The method of claim 1 further comprising roughening lower surfaces of the trenches.

10. The method of claim 1, wherein providing the semiconductor wafer includes providing a backmetal layer on a surface opposite to the singulation lines, and wherein propagating the cracks comprises propagating through the backmetal layer.

11. A method of singulating semiconductor die from a semiconductor wafer comprising:
providing a semiconductor wafer having a plurality of semiconductor die formed on a first surface of the semiconductor wafer and separated by singulation lines, wherein the singulation lines are portions of the semiconductor wafer and have trenches formed therein, and wherein the semiconductor wafer further has a layer of conductive material extending across a second surface opposed to the first surface;
heating the trenches without forming molten matter to form a localized stress in the trenches; and
cooling the trenches thereby propagating cracks within the trenches generally downward and completely through the semiconductor wafer and the layer of conductive material to singulate the semiconductor die from the semiconductor wafer.

12. The method of claim 11 further comprising roughening lower surfaces of the trenches before heating the trenches.

13. The method of claim 11, wherein providing the semiconductor wafer comprises providing trenches having a depth greater than or equal to ten microns.

14. The method of claim 11, wherein heating the trenches comprises heating the trenches using a thermal laser process.

15. The method of claim 11, wherein providing the semiconductor wafer comprises providing the trenches having a reflective material formed on sidewalls of the trenches.

16. A method of singulating semiconductor die from a semiconductor wafer comprising:
providing a semiconductor wafer having a plurality of semiconductor die formed on the semiconductor wafer and separated by singulation lines, wherein the singulation lines are portions of the semiconductor wafer and have trenches formed therein;
heating the trenches with a thermal laser process without forming molten matter to form a localized stress in the trenches;
cooling the trenches to form cracks within the trenches; and
propagating the cracks into the semiconductor wafer to singulate the semiconductor die from the semiconductor wafer, wherein the trenches are configured to control crack propagation.

17. The method of claim 16, wherein providing the semiconductor wafer comprises providing the trenches having a depth greater than or equal to ten microns.

18. The method of claim 16, wherein providing the semiconductor wafer comprises providing a trench-within-trench configuration formed using a self-aligned spacer process.

19. The method of claim 16, wherein providing the semiconductor wafer comprises providing the trenches comprising one of a rounded shape, a square shape, or a triangular shape.

20. The method of claim 16, wherein the step of providing the semiconductor wafer comprises providing a wafer backside coating layer on a surface opposite the trenches, and wherein propagating the cracks includes propagating through the wafer backside coating layer.

* * * * *